(12) United States Patent
Tailliet et al.

(10) Patent No.: US 6,934,192 B2
(45) Date of Patent: Aug. 23, 2005

(54) EEPROM MEMORY PROTECTED AGAINST THE EFFECTS FROM A BREAKDOWN OF AN ACCESS TRANSISTOR

(75) Inventors: François Tailliet, Epinay sur Seine (FR); Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 373 days.

(21) Appl. No.: 10/178,796

(22) Filed: Jun. 24, 2002

(65) Prior Publication Data
US 2003/0035329 A1 Feb. 20, 2003

(30) Foreign Application Priority Data
Jun. 25, 2001 (FR) .............................. 01 08347

(51) Int. Cl.[7] .............................................. G11C 16/04
(52) U.S. Cl. ....................... 365/185.29; 365/185.18; 365/185.23; 365/185.33; 365/185.26
(58) Field of Search ....................... 365/185.29, 185.18, 365/185.23, 185.33, 185.26

(56) References Cited

U.S. PATENT DOCUMENTS

| | | | | |
|---|---|---|---|---|
| 4,254,477 A | * | 3/1981 | Hsia et al. .................. | 365/200 |
| 5,414,286 A | | 5/1995 | Yamauchi .................... | 257/315 |
| 5,862,082 A | | 1/1999 | Dejenfelt et al. ...... | 365/185.33 |
| 5,981,340 A | | 11/1999 | Chang et al. ................. | 438/258 |
| 5,995,423 A | | 11/1999 | Lakhani et al. .............. | 365/200 |
| 6,114,724 A | | 9/2000 | Ratnakumar ................. | 257/326 |
| 6,128,222 A | * | 10/2000 | Moreaux ................ | 365/185.18 |
| 6,266,274 B1 | * | 7/2001 | Pockrandt et al. ...... | 365/185.17 |
| 6,501,684 B1 | * | 12/2002 | Park et al. .............. | 365/185.33 |

FOREIGN PATENT DOCUMENTS

| | | | | |
|---|---|---|---|---|
| EP | 0255963 | 2/1988 | ........... | G11C/17/00 |
| EP | 0763856 | 3/1997 | ......... | H01L/29/788 |
| GB | 2251104 | 6/1992 | ........... | G11C/16/06 |

* cited by examiner

Primary Examiner—Connie C. Yoha
(74) Attorney, Agent, or Firm—Lisa K. Jorgenson; Allen, Dyer, Doppelt, Milbrath & Gilchrist, P.A.

(57) ABSTRACT

An electrically programmable and erasable memory includes memory cells, with each memory cell including a floating gate transistor and an access transistor. The floating gate transistor has a first terminal connected to the access transistor. The memory includes circuitry for respectively applying during an erasing phase a first signal, and a second signal on the control gate and on a second terminal of the floating gate transistors of the memory cells to be erased. The circuitry also applies to the gates of the corresponding access transistors of the memory cells to be erased a signal having a voltage that is different from a voltage of the first signal and has a low or zero potential difference with respect to a voltage of the second signal. The memory is protected against the effects from a breakdown of the gate oxide of an access transistor.

30 Claims, 7 Drawing Sheets

EEPROM MEMORY PROTECTED AGAINST THE EFFECTS FROM A BREAKDOWN OF AN ACCESS TRANSISTOR

FIELD OF THE INVENTION

The present invention relates to electronics, and more particularly, to an electrically programmable and erasable memory.

BACKGROUND OF THE INVENTION

FIG. 1 represents an example of an EEPROM memory 10 comprising memory cells, with each memory cell comprising a floating gate transistor and a MOS type access transistor. The floating gate transistor has a first terminal connected to the access transistor. The memory 10 further includes means for respectively applying during the erasing phases of the memory cells a first electrical voltage and a second electrical voltage on the control gate and on the second terminal of the floating gate transistors of the memory cells to be erased.

The memory 10 comprises memory cells $CE_{i,j}$ connected to lines for selecting a word line $WLSL_i$ and to bit lines $BL_j$. The bit lines are grouped in columns $COL_k$ comprising M bit lines $BL_0$ to $BL_{M-1}$. The memory cells connected to a same selection line $WLSL_i$ form a word line $WL_i$. The memory cells of a same word line $WL_i$ connected to M bit lines of a column $COL_k$ form a memory word $W_{i,k}$ providing storage for M bits. For the sake of simplicity, a single word $W_{i,k}$ belonging to a column $COL_k$ and to a word line $WL_i$ is illustrated in FIG. 1.

Each memory cell $CE_{i,j}$ comprises a floating gate transistor FGT and an access transistor AT of the MOS type. Transistor AT has its gate connected to line $WLSL_i$, its drain D is connected to a bit line $BL_j$ and its source S is connected to the drain D of the FGT transistor. Transistor FGT has its control gate G connected to a gate control line $CGL_k$, and its source S connected to a source line SL. The source line SL is connected to ground via a SLT transistor driven by a signal SLS. The $CGL_k$ line is connected to a line for selecting a column $CL_k$ via a gate control transistor $CGT_k$, with its gate connected to line $WLSL_i$.

Each $WLSL_i$ line is controlled by a signal $V_{WL}$ delivered by an output $OUT_i$ of a line decoder RDEC. Each $CL_k$ line is controlled by a gate control signal $V_{CG}$ delivered by a column latch $LT_k$, and each latch $LT_k$ is controlled by a column selection signal $SCOL_k$ delivered by an output $OUT_k$ of a column decoder CDEC. Decoders RDEC and CDEC respectively receive the most significant bits ADH and the least significant bits ADL of the address of the word $W_{i,k}$ to be selected.

Each bit line $BL_j$ is connected to a programming latch $LP_j$ driven by a column selection signal $SCOL_k$. Each latch $LP_j$ is connected to a bus WB for receiving, before a programming operation, one data bit $B_j$ from M bits, $b_0$ to $b_{M-1}$. Each bit line $BL_j$ is also connected to a readout amplifier $SA_j$ via a column selection transistor $TS_k$, a readout transistor TR and a multiplexing bus MB. Transistors $TS_k$ are driven by the column selection signal $SCOL_k$ whereas the readout transistors TR are driven by a readout signal READ. The M bits of a word $W_{i,k}$ may be read by readout amplifiers, $SA_0$ to $SA_{M-1}$, connected at the input to the multiplexing bus MB and at the output to the bus RB.

In such a memory, a memory cell erasing or programming operation includes injecting or extracting electrical charges by the tunnel effect (Fowler Nordheim effect) in/from the floating gate of the FGT transistors. An erased FGT transistor has a threshold voltage VT1, and a programmed FGT transistor has a threshold voltage VT2. When a readout voltage Vread between VT1 and VT2 is applied on its control gate, an erased FGT transistor remains blocked which conventionally corresponds to a logic 1, and a programmed transistor is conducting which conventionally corresponds to a logic 0. A reverse convention may also be used.

The collective erasing of the FGT transistors of a word line $WL_i$ is obtained by applying a voltage Vpp from 15 to 20 V on the control gate of the FGT transistors, while the source line SL is set to 0 and the drain of the FGT transistors is at a floating potential. Individual programming of the FGT transistors is achieved by applying the voltage Vpp on the drains of the FGT transistors via the access transistors AT, while the control gate of the FGT transistors is set to 0 and the source line SL is at a floating potential. These operations are achieved by decoders RDEC, CDEC and latches $LC_k$, $LP_j$ by having the supply voltage Vcc of these components increase 3 to 5V to the voltage Vpp.

TABLE 1 summarizes the values of the control signals during the erasing, programming and readout operations for a memory cell $CE_{i,j}$. $V_S$ is the control signal present on the source line SL, $V_{BL}$ is the control signal present on the bit line $BL_j$ and Vsense is a signal delivered by the readout amplifiers.

TABLE 1

| | Operation⇒ | | |
|---|---|---|---|
| Control signals ⇓ | ERASING | PROGRAMMING | READOUT |
| $V_{CG}$ | Vpp | 0 (ground) | Vread |
| $V_{WL}$ | Vpp | Vpp | Vcc |
| $V_S$ | 0 (ground) | floating | 0 (ground) |
| $V_{BL}$ | floating | Vpp | Vsense |

Because the voltage Vpp is applied on their gate or on their drain, the access transistors AT and the floating gate transistors FGT are subject to a significant electrical stress during the successive erasing/programming cycles. The gate oxide of these transistors are selected accordingly, and these are high voltage oxides assumed capable of withstanding voltages which may attain 30 V. However, these gate oxides are not perfect and have various defects or impurities which may cause their breakdown in normal conditions of use. Thus, the breakdown of an access transistor or a floating gate transistor is occasionally observed after a few hundred or thousand erasing/programming cycles. Although the breakdown probability for a transistor is low, the number of memory cells present in an EEPROM memory is high, and statistically, the rejection rate of faulty memories is not insignificant.

To overcome this drawback, it is known how to associate an error correction code or ECC code with data bits stored in the memory, allowing at least one erroneous bit to be detected and corrected in a string of bits. For example, by adding a 4 bit Hamming code to 8 data bits, an erroneous bit may be detected and corrected upon reading the string of bits. This precaution is found to be generally sufficient for correcting the consequences of the breakdown of a floating gate transistor, but is found to be inefficient for countering a fault of an access transistor. However, it is often impossible to properly erase the memory cells of a word line $WL_i$ comprising a faulty access transistor or to properly program memory cells connected to a bit line $BL_j$ comprising a faulty access transistor.

As it will be explained in detail below, these drawbacks are attributable to the existence of a short-circuit between the gate and the drain or the source of the access transistor, which causes the voltage Vpp to drop on the line for selecting the word line during an erasing cycle or which causes the voltage Vpp to drop on the bit line during a programming cycle.

SUMMARY OF THE INVENTION

In view of the foregoing background, an object of the present invention is to be able to erase memory cells belonging to a word line comprising a faulty access transistor.

Another object of the present invention is to be able to program cells attached to a bit line comprising a faulty access transistor.

These and other objects, advantages and features of the present invention are provided by an electrically programmable and erasable memory of the type described above, comprising means for applying to the gate of access transistors of memory cells to be erased a determined electrical signal, the voltage value of which is different from the first electrical voltage and has a low or zero potential difference with respect to the second electrical voltage.

The second voltage may have a value of zero during the erasing phases. The determined electrical signal may have a voltage value of zero during the erasing phases. The determined electrical signal may also be brought to a floating potential during the erasing phases.

According to one embodiment, the memory comprises memory cells may be laid out in word lines, with a line decoder delivering at least one signal for selecting a word line during phases for erasing, programming and reading the memory cells, first conducting means for conveying the word line selection signal onto the gate of the access transistors of the memory cells of a word line, and means for preventing the word line selection signal from being applied on the first conducting means during erasing phases, and for applying the determined electrical signal instead of the word line selection signal.

According to another embodiment, the means for preventing the application of a word line selection signal comprise a logic circuit connected at the output of the first conducting means. The means receive as an input the word line selection signal and a control signal, recopies the word line selection signal when the control signal has a first value, and delivers the determined electrical signal when the control signal has a second value.

According to one embodiment, the memory comprises gate control transistors for controlling the control gates of floating gate transistors, and second conducting means, distinct from the first conducting means, for conveying a word line selection signal onto the gates of control gate transistors.

According to another embodiment, the memory comprises bit lines connected to the access transistors for programming or reading the memory cells, and means for limiting a programming current flowing in at least one bit line during the programming of at least one memory cell.

The memory may comprise a current limiter laid out between each bit line and a programming voltage source. The current limiter may be in a programming latch connected to at least one bit line. The current limiter may comprise a transistor driven by a reference voltage delivered by a common current control circuit to all or a part of the bit lines of the memory.

According to one embodiment, the memory comprises gate control transistors for controlling the control gates of floating gate transistors, and means for applying onto the gates of the gate control transistors, during the programming phases, a lower voltage than a programming voltage.

The present invention also relates to a method for erasing and programming memory cells each comprising a floating gate transistor, and an access transistor of the MOS type. The floating gate transistor has a first terminal connected to the access transistor. The erasing of a memory cell respectively comprises the application of a first electrical voltage and of a second electrical voltage onto the control gate and onto a second terminal of the floating gate transistors of the memory cells to be erased. The erasing of memory cells may comprise the application, onto the gate of the access transistors of the memory cells to be erased, of a determined electrical signal. The voltage value of this signal is different from the first electrical voltage and has a low or zero potential difference with respect to the second electrical voltage.

The second voltage may have a value of zero during the erasing phases. The determined electrical signal may have a voltage value of zero during the erasing phases. The determined electrical signal may be brought to a floating potential during the erasing phases.

According to one embodiment, the method is implemented in a memory comprising memory cells laid out in word lines, and a line decoder delivers at least one word line selection signal during the phases for erasing, programming and reading the memory cells. First conducting means are provided to convey a word line selection signal onto the gate of the access transistors of the memory cells of a word line. The method comprises a step of preventing the word line selection signal from being applied on the first conducting means during the erasing phases, and of applying the determined electrical signal instead of the word line selection signal.

According to one embodiment, a selection signal is prevented from being applied on the first conducting means by a logic circuit connected at the output to the first conducting means. The method may comprise receiving at the input the word line selection signal and a control signal, recopying the word line selection signal when the control signal has a first value, and delivering the determined electrical signal when the control signal has a second value.

According to another embodiment, the method is implemented in a memory comprising gate control transistors for controlling the control gates of floating gate transistors, and comprises a step of providing second conducting means, distinct from the first conducting means, to convey a word line selection signal onto the gates of the gate control transistors.

The programming of a memory cell may comprise the application of a programming voltage on a bit line connected to the access transistor of the memory cell, and the limitation of a programming current flowing in the bit line if the programming current attains a determined value. The limitation of a programming current is provided by a current limiter laid out between the bit line and a programming voltage source. The programming current limiter may be in a programming latch connected to the bit line.

According to one embodiment, the method is implemented in a memory comprising gate control transistors for controlling control gates of floating gate transistors, and comprises the application onto the gates of gate control transistors, during the programming phases, of a lower voltage than a programming voltage.

BRIEF DESCRIPTION OF THE DRAWINGS

These and other objects, features and advantages of the present invention will be discussed more in detail in the following description of the method according to the invention and of an EEPROM memory according to the invention, provided as non-limiting, with reference to the appended figures wherein.

DETAILED DESCRIPTION OF THE PREFERRED EMBODIMENTS

The present invention is based on a detailed analysis of problems caused by the failure of an access transistor of an EEPROM memory cell, which will be discussed later on. First, it will be noted that the object of the present invention is not to provide repair of a memory cell comprising a faulty access transistor, the condition of which is irreversible, but to maintain the memory in an operational condition in spite of the existence of a faulty access transistor.

The term operational condition means that it is possible to proceed with an erasing or programming operation on neighboring memory cells belonging to the same word line or to the same bit line as the faulty cell. In other words, the idea of the present invention is to confine the effects of a failure of a transistor for accessing the cell containing the faulty transistor, and to prevent this dysfunction from contaminating the neighboring cells, in terms of programmability or erasability of these cells. Actually, a fault acting on a single memory cell may always be corrected upon reading by conventional error correction techniques using ECC codes, for example, Hamming codes, whereas a fault affecting a set of cells cannot be corrected.

Figure 2:
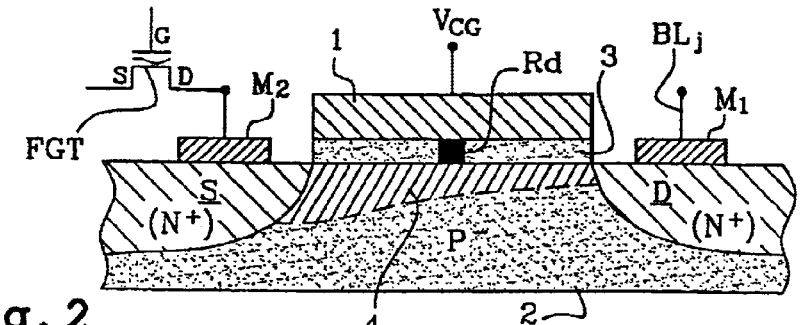
FIG. 2 is a sectional view of an access transistor, the gate oxide of which has broken down according to the prior art.

The present invention is first based on the assumption that a fault of an access transistor AT is attributable to a breakdown of the oxide of the transistor gate. As illustrated in FIG. 2, the gate of an access transistor AT comprises a gate material 1 (polycrystalline silicon) deposited on a silicon substrate 2, for example, of the P-type, via an oxide layer 3. Drain D and source S regions, for example, of the N+ type, are implanted on each side of the gate material 1. These drain and source regions are respectively connected, through metal contacts M1 and M2, to a bit line $BL_j$ and to the drain D of a floating gate transistor FGT.

A breakdown of the oxide layer 3 causes the occurrence of a leak resistance Rd, the value of which may be estimated to be on the order of a few hundred kΩ. This resistance Rd is represented in a central position with respect to the drain and source regions, but it may also appear on the edge of the gate, either on the drain side or the source side.

FIGS. 3A–3E represent a conventional memory cell $CE_{i,j}$ in five different situations, and illustrate the analysis conducted by the inventors in order to understand the effect from the breakdown of an access transistor on the neighboring cells, and to find practical remedies on the basis of the aforementioned assumption (existence of a leak resistance Rd). Faults such as the breakdown of a conducting line are not considered here.

Figure 1:
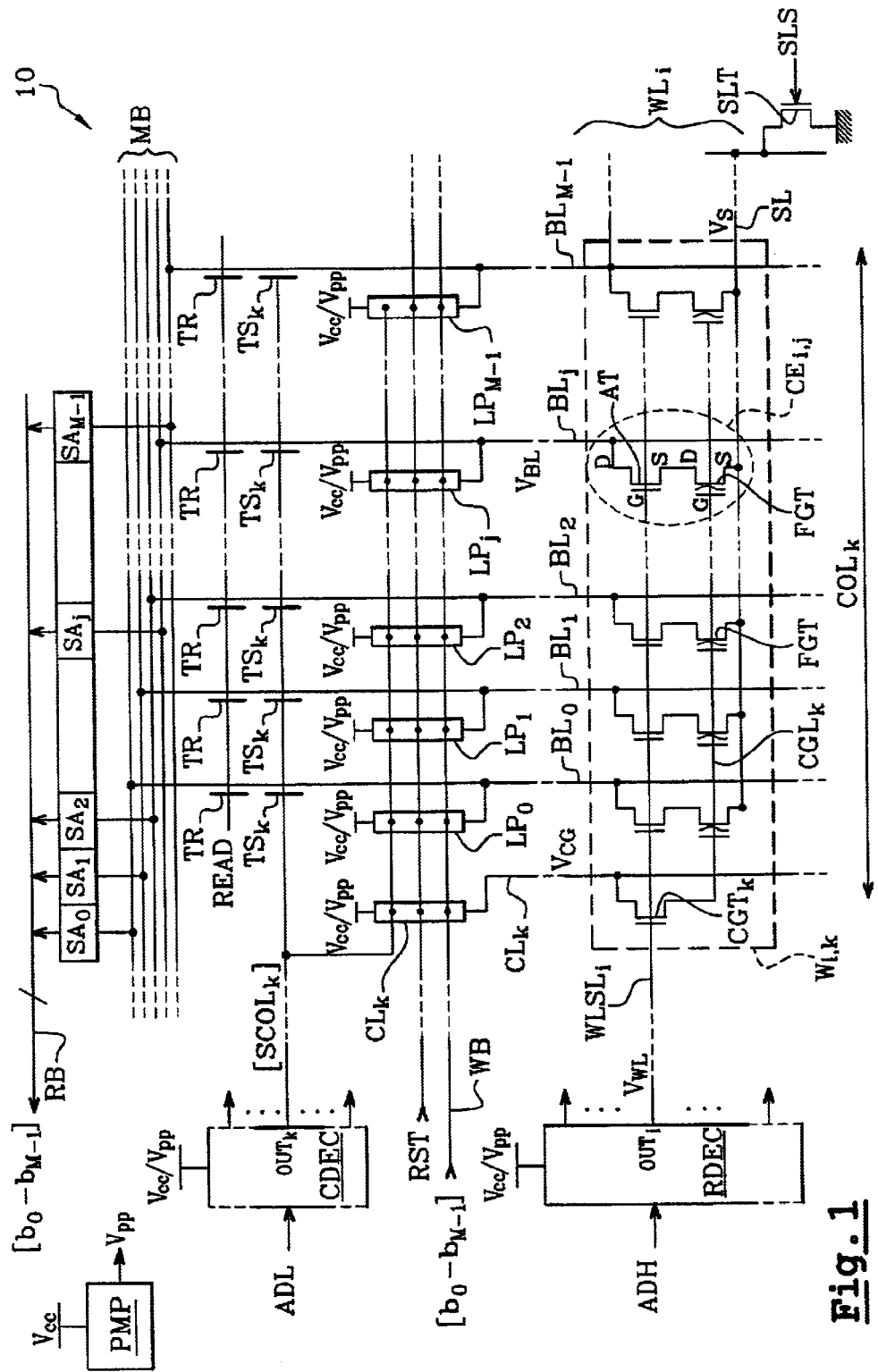
FIG. 1 represents an example of the architecture of a conventional EEPROM memory according to the prior art.

In these figures, the layout of the cell $CE_{i,j}$ complies to the one described above and the reference symbols of the different components are retained. Cell $CE_{i,j}$ thus comprises an access transistor AT and a transistor FGT. Transistor AT has its gate G connected to a word line selection line $WLSL_i$ receiving a control signal $V_{WL}$, its drain D is connected to a bit line $BL_j$ receiving a control signal $V_{BL}$, and its source is connected to the drain of the FGT transistor. The FGT transistor has its source S connected to a source line SL receiving a control signal $V_S$, and its control gate connected to a gate control line $CGL_k$. Line $CGL_k$ receives via a gate control transistor $CGT_k$, a gate control signal $V_{CG}$ is delivered by a column latch ($LC_k$) (FIG. 1). Transistor $CGT_k$ further has its gate connected to the selection line $WLSL_i$.

Figure 3A:
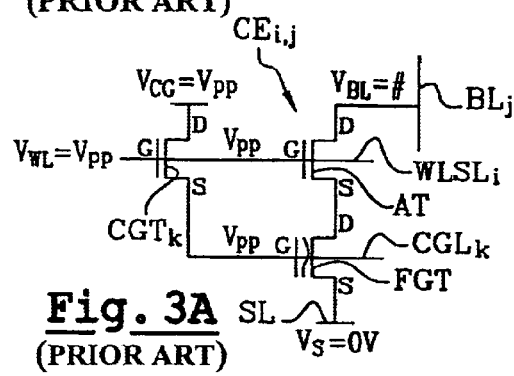
FIGS. 3A–3E represent the electrical voltages applied to a conventional EEPROM memory cell in five different situations, and illustrates a fault analysis which is an integral part of the present invention.

In FIG. 3A, cell $CE_{i,j}$ is in the erasing phase and the control signals have the values mentioned in TABLE 1 under the column ERASING. The access transistor AT receives the Vpp voltage on its gate, its drain is at a floating potential (represented by the symbol #) and its source is connected to ground ($V_S$=0) via the FGT transistor, which is conducting (voltage Vpp is on the control gate of the FGT transistor). Under these conditions, a breakdown of the oxide layer between the gate and the source of the access transistor AT causes a short-circuit between the voltage Vpp and ground. The result is a collapse of the Vpp voltage because the voltage source delivering the Vpp voltage, for example, a charging pump PMP illustrated in FIG. 1, does not have sufficient fan-out for withstanding the leakage current. The collapse of voltage Vpp prevents the erasing of the other memory cells of the relevant word line.

Figure 3D:
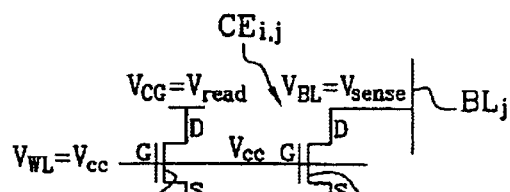
Figure 3B:
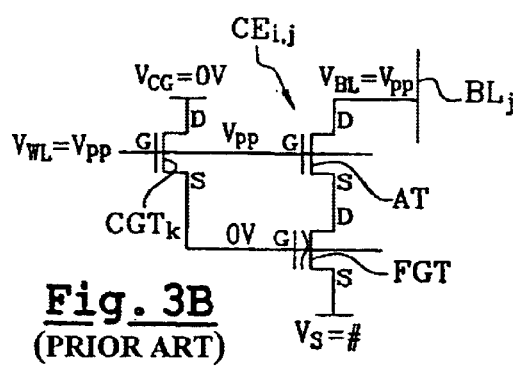

A first object of the invention is thus to find a remedy to this problem. In FIG. 3B, the cell is in the programming phase and the control signals have the values mentioned in TABLE 1 under the column PROGRAMMING. The access transistor AT receives the voltage Vpp on its gate and on its drain, and its source is at a floating potential (floating $V_S$ signal and zero voltage on the control gate of the FGT transistor).

Under these conditions, a conducting channel 4 (FIG. 2) appears in transistor AT. If the oxide of the gate of transistor AT has broken down and has a leak resistance Rd, channel 4 insulates the voltage Vpp present on the gate of the silicon substrate 2. The fault may thus be tolerated as it does not prevent the simultaneous programming of the memory cells belonging to the same word line. The fault does not contaminate the neighboring cells. The progress of the programming process of the FGT transistor remains uncertain for cell $CE_{i,j}$. In any case, the memory cell is considered as faulty and will not be able to be read, as this will be seen further on.

Figure 3E:
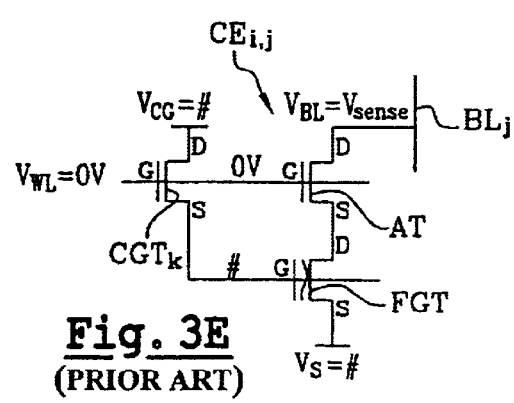
Figure 3C:
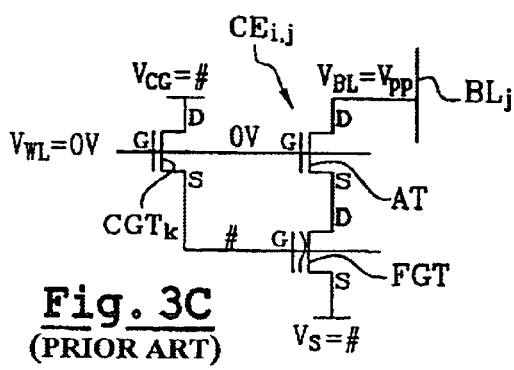

In FIG. 3C, cell $CE_{i,j}$ is not in the programming phase but is connected to a bit line $BL_J$ receiving the voltage Vpp as another memory cell connected to this bit line is in the programming phase. The access transistor AT has its gate grounded as the word line to which it belongs has not been selected. If the gate oxide of the AT transistor has broken down, and the breakdown resistance Rd is located on the drain side, voltage Vpp on the bit line is short-circuited to ground. A current leak occurs which leads to the collapse of voltage Vpp, preventing the programming of the memory cell connected to the bit line.

A second object of the present invention is thus to find a remedy to this problem. In FIG. 3D, the memory cell is in the readout phase and the control signals have the values mentioned in TABLE 1 under the column READOUT. The access transistor AT receives the voltage Vsense on its drain and the voltage Vcc on its gate. Its source is grounded ($V_S=0$) via the FGT transistor (voltage Vread is on the control gate of the FGT transistor).

A breakdown of the gate oxide layer of the access transistor causes a short-circuit between its gate and its conducting channel 4 (FIG. 2). The condition of the access transistor AT, either conducting or non-conducting, is uncertain. Regardless of the case, the cell is considered as faulty and the bit which is read therefrom is considered as non-valid. The readout fault may be corrected by an ECC code, as indicated earlier. The effects of the fault do not contaminate the readout process of the neighboring cells.

In FIG. 3E, the memory cell is not in the readout phase, but is connected to a bit line $BL_J$ receiving the voltage Vsense as another memory cell connected to this bit line is being read. The drain of the access transistor AT thus receives the voltage Vsense, while its gate is grounded, as the word line is not selected. Here, a breakdown of the oxide layer of the access transistor causes a short-circuit between the voltage Vsense and ground, and the occurrence of a leak current which disturbs the detection of the conducting or blocked condition of the neighboring cell during the readout. Accordingly, any other memory cell connected to the bit line $BL_J$ cannot be read properly. As in the previous case, this fault may be tolerated and corrected by an ECC code, as indicated earlier, because this only concerns one single memory cell per word line.

Eventually, according to the present invention, it appears that the presence of a faulty access transistor in a memory causes a storage error of one bit which may be corrected upon readout by a conventional error correction code, but this leads to two crippling consequences. The first occurs upon erasing cells belonging to the word line comprising the faulty access transistor, and the second occurs upon programming the cells connected to the same bit line as the faulty access transistor.

Two aspects of the present invention will now be described for overcoming both of these drawbacks.

I. Correction of the Effects from the Breakdown of an Access Transistor During the Erasing Phases The present invention is based on the observation according to which it is unnecessary to select an access transistor by the voltage Vpp in the erasing phase, as the erasing process only requires the application of the voltage Vpp on the control gate of the floating gate transistors and the application of an electric potential with a determined value on the source of these transistors, generally ground. According to a first aspect of the present invention, it is thereby suggested not to apply the voltage Vpp on the gate of the access transistors during the erasing periods. More specifically, the voltage which should be applied on the gate of the access transistors should be such that the voltage Vpp does not collapse during an erasing operation, in the case of a short-circuit between the gate and the source of an access transistor.

Figure 4:
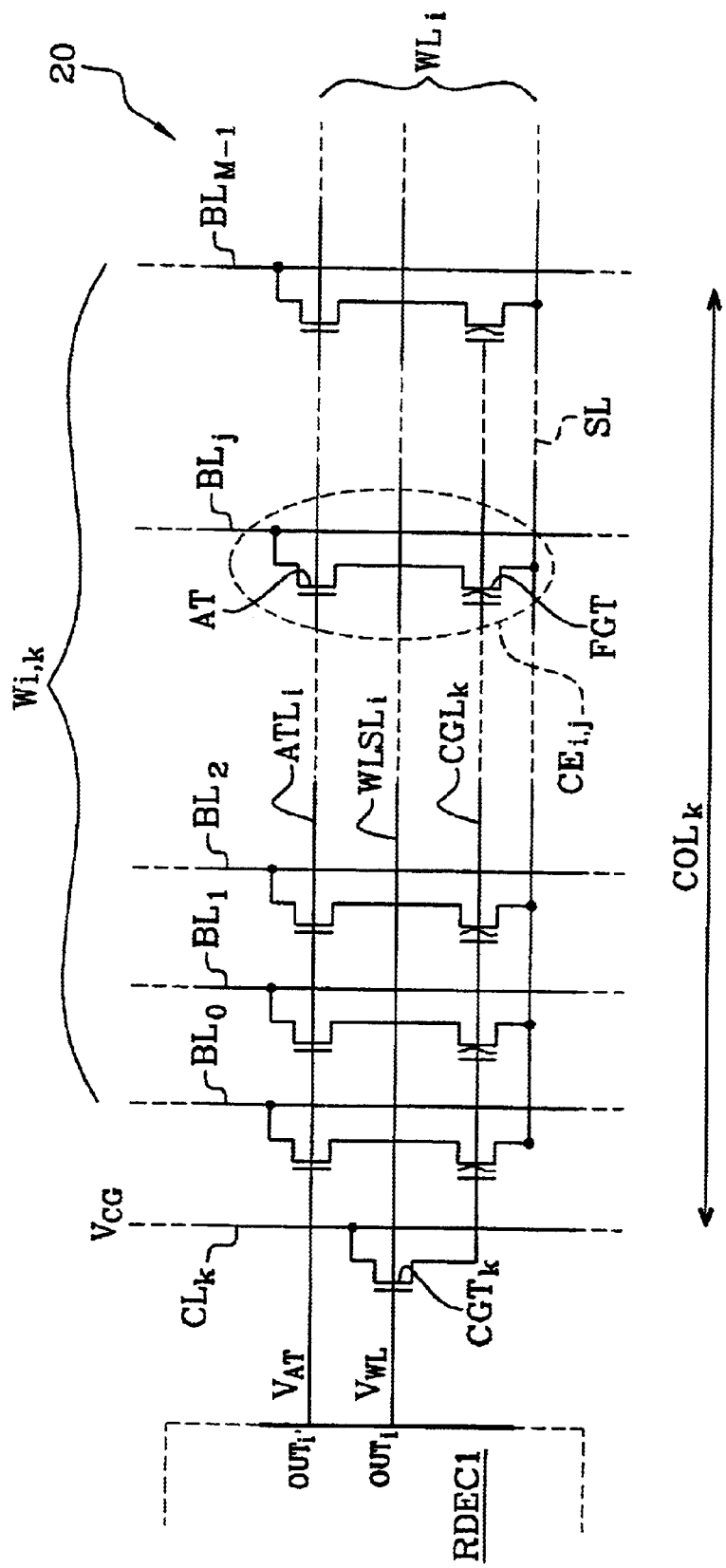
FIG. 4 represents a word line architecture according to the present invention.

FIG. 4 is a partial view of a memory 20 according to the invention and represents an architecture of a word line $WL_i$ for implementing the first aspect of the invention. For the sake of simplicity in the figure, only one word $WL_{i,k}$ comprising M memory cells $CE_{i,j}$ is represented on the word line $WL_i$. Word $W_{i,k}$ belongs to a column $COL_k$ comprising M bit lines $BL_0$ to $BL_{M-1}$.

Conventionally, each memory cell comprises a floating gate transistor FGT and an access transistor AT. Transistor AT has its drain connected to a bit line $BL_j$ and its source connected to the drain of the FGT transistor, the source of which is connected to a source line SL. The control gate of the FGT transistor is connected to a gate control line $CGL_k$ which is connected to a column selection line $CL_k$, via a gate control transistor $CGT_k$, common to all the cells of the word $W_{i,k}$. The column selection line $CL_k$ receives a gate control signal $V_{cg}$, delivered by a column latch (not shown), and the control gate of transistor $CGT_k$ is connected to a word line selection line $WLSL_i$.

According to the invention, the gate of the access transistor AT of each memory cell is not connected to the word line selection line $WLSL_i$ and is connected to a special line $ATL_i$, provided for controlling the gates of the access transistors. The selection line $WLSL_i$ is only connected to the gate control transistor $CGT_k$, as well as to the gate control transistors of the other words belonging to the word line $WL_i$ (not shown).

The selection line $WLSL_i$ is connected to an output $OUT_i$ of a line decoder RDEC1 conventionally delivering a signal $V_{WL}$ for selecting a word line. According to the invention, the decoder REDC1 comprises a second output $OUT_i$, which is connected to line $ATL_i$ and which delivers a signal $V_{AT}$ providing the control of the gate of the access transistors. Signal $V_{AT}$ is identical with signal $V_{WL}$ during the programming and readout phases, and memory 20 thus operates during programming and readout in a conventional way. On the other hand, during the erasing phases, signal $V_{AT}$ is brought to a voltage equal to that of signal $V_S$ located on the source of the floating gate transistors, i.e., zero voltage.

It is seen that the problem discussed earlier in connection with FIG. 3A no longer exists here as the voltage difference between the gate of an access transistor AT and the source of the floating gate transistor FGT is zero, and signals $V_{AT}$ and $V_S$ are equal in voltage during the erasing periods. Thus, the breakdown of the gate oxide of an access transistor does not cause any short-circuit between the voltage Vpp and the voltage $V_S$. The possible fault of an access transistor is therefore confined to the memory cell containing the access transistor, without contaminating the other cells, in terms of erasability of these cells.

TABLE 2 summarizes the values of the control signals during the operations for erasing, programming and reading the memory 20. As earlier, the control signal present on the bit line $BL_J$ is designated as $V_{BL}$. Voltage Vcc is on the order of 3 to 5 V, voltage Vpp is on the order of 15 to 20 V, and the voltage delivered by the readout amplifiers is designated as Vsense.

The values mentioned in bold characters distinguish the memory according to the invention from a conventional memory. It appears clearly that in the erasing phase, the voltage difference between the signal $V_{AT}$ and the signal $V_S$ is zero. It also appears that in the programming phase, the word line structure according to the invention enables voltage Vpp or voltage Vcc to be indifferently applied to the word line selection line WLSL$_i$ (signal V$_{WL}$), as the gate control transistor CGT$_k$ should only connect to ground for the control gate of the FGT transistors (signal V$_{CG}$=0). Signal V$_{WL}$ may then be selected so as to be different from signal V$_{AT}$ in the programming phase in regards to its voltage value. The advantage of controlling gate control transistors CGT with voltage Vcc in the programming phase is to limit the electrical stress suffered by these transistors.

TABLE 2

| Control signals ⇓ | Operation⇒ | | |
|---|---|---|---|
| | ERASING | PROGRAMMING | READOUT |
| V$_{CG}$ | Vpp | 0 (ground) | Vread |
| V$_{WL}$ | Vpp | Vpp (or Vcc) | Vcc |
| V$_{AT}$ | 0 (ground) | Vpp | Vcc |
| V$_S$ | 0 (ground) | floating | 0 (ground) |
| V$_{BL}$ | floating | Vpp | Vsense |

Generally speaking, the implementation of this aspect of the present invention requires less changes as compared with a conventional memory. These changes comprise the addition of the ATL$_i$ line and the modification of the electrical connections at the gates of the access transistors AT.

Figure 5:
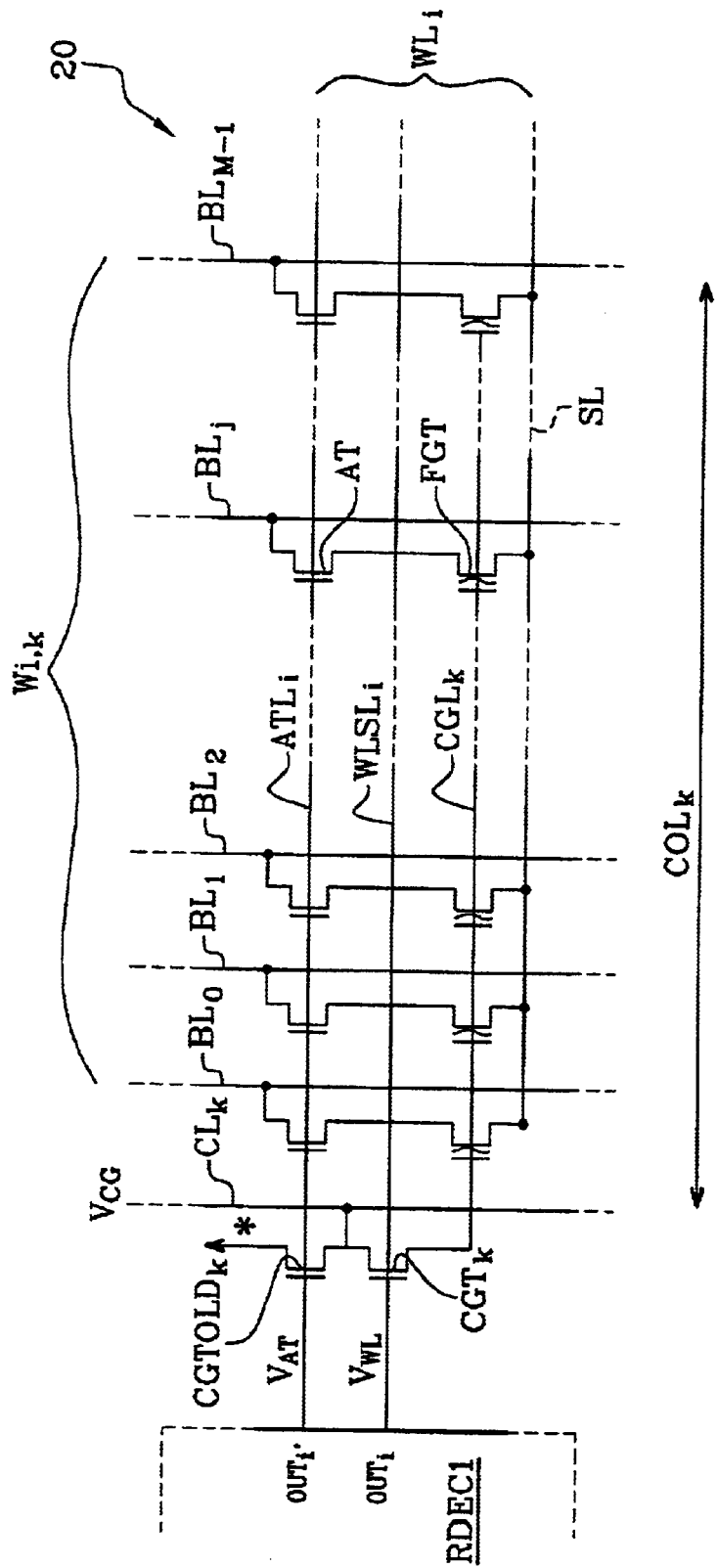
FIG. 5 represents an alternative embodiment of the word line architecture represented in FIG. 4.

FIG. 5 represents an architecture of a word line WL$_i$ similar to the previous one, but which may be simply obtained from the topography or layout of a conventional memory, with a minimum of modifications. The original gate control transistor designated as CGTOLD$_k$ is retained but is not connected to the column selection line CL$_k$. A new gate control transistor CGT$_k$ is added to each word present in the word line WL$_i$. The selection line WLSL$_i$ is also added and it corresponds practically to a metal line passing over the gate of the gate control transistor CGT$_k$ (and over the control gates of transistors CGT$_k$ of the other words present on the word line, not shown here). The drain of the unused transistor CGTOLD$_k$ may be connected to the drain of the other CGTOLD$_k$ transistors present on the other word lines of the memory (not shown).

Thus, this embodiment does not require any undoing of the original connections between the gates of the access transistors AT, as the original selection line WLSL$_i$ becomes the control line ATL$_i$ reserved for the access transistors AT.

Figure 6:
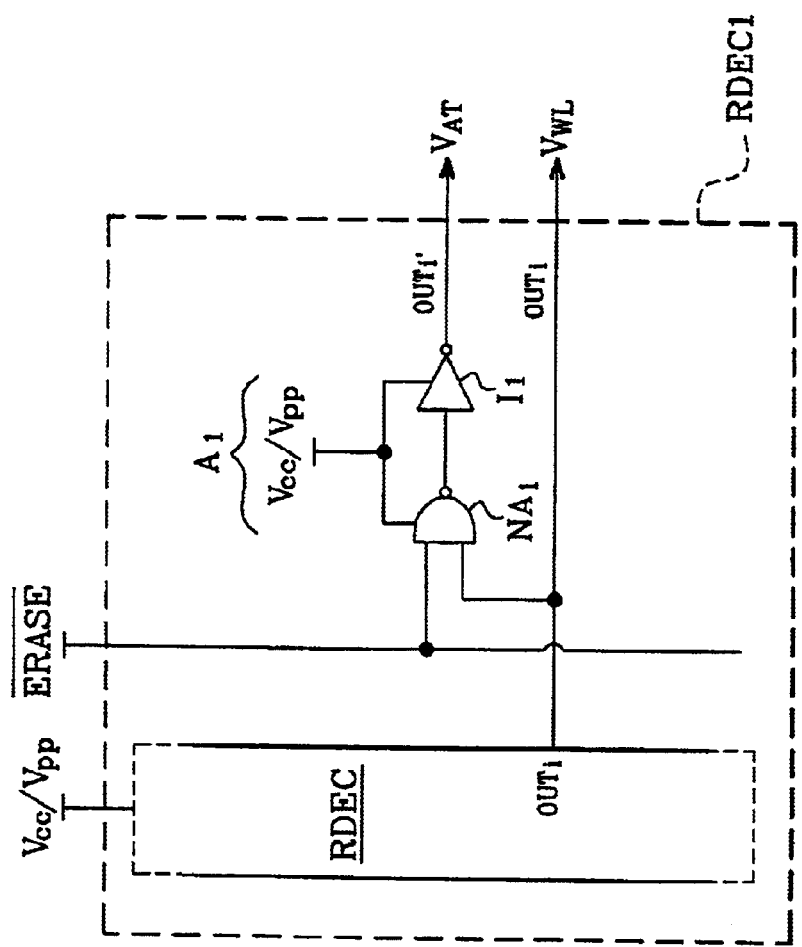
FIG. 6 represents a characteristic of a line decoder according to the invention, provided in connection with the word line architecture represented in FIG. 4 or 5.

The anticipated changes in a conventional line decoder RDEC for obtaining a RDEC1 decoder according to the invention, are also straightforward as illustrated in FIG. 6. In this figure, the original decoder RDEC is retained, and the output OUT$_i$ of the RDEC decoder forms the output OUT$_i$ of the RDEC1 decoder according to the invention. The output OUT$_i$', which delivers the V$_{AT}$ signal is formed by the output of an AND gate A1 receiving at its input the signal V$_{WL}$ and a signal/ERASE. Conventionally, the gate A1 is obtained by associating a NAND gate referenced as NA1 in series with an inverting gate I1. The signal/ERASE is set to 1 (voltage Vpp) during the programming phases, and is also set to 1 (voltage Vcc) during the readout phases, so that the signal V$_{AT}$ recopies the signal V$_{WL}$. During an erasing phase, the signal/ERASE is set to 0 and the V$_{AT}$ signal switches to 0.

Figure 7:
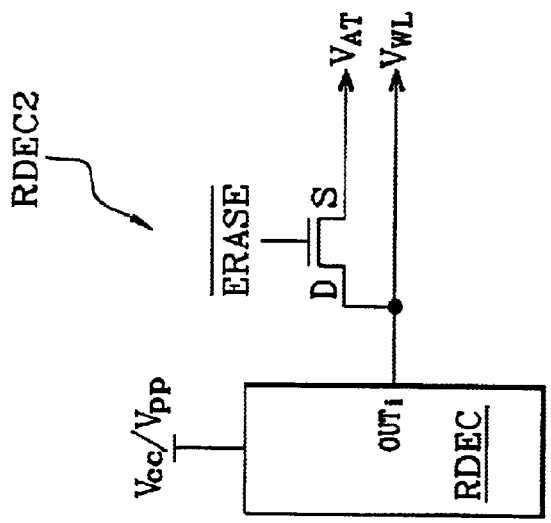
FIG. 7 represents an alternative embodiment of the decoder of FIG. 6.

The voltage value of signal V$_{AT}$, providing a zero voltage difference between the gate of an AT transistor and the source of a FGT transistor, may also be a floating potential instead of ground. If a short-circuit exists between the gate and the source of the access transistor, the gate of the access transistor is found at the same electrical potential as the source of the floating gate transistor (V$_S$), which is compatible with the application of a floating potential on line ATL$_i$. FIG. 7 illustrates an embodiment of a RDEC2 decoder according to the invention, wherein the signal V$_{AT}$ is delivered by the source S of a MOS transistor, the drain D of which is connected to the output OUT$_i$ of the RDEC decoder. The MOS transistor is driven by the signal/ERASE and its drain delivers a control signal V$_{AT}$ which is floating when the signal/ERASE is set to 0.

Although the application of a zero voltage or of a floating potential on the gates of the access transistors during the erasing phases was suggested above, it is obvious that the signal V$_{AT}$ might be set to another value if the voltage V$_S$ applied on the source of the floating gate transistors was different from 0. For example, some erasing methods involve a negative source voltage. In this case, a negative voltage would be applied on the gate of the access transistors during the erasing phases.

An alternative to the decoder described above includes providing, during the programming phases, the application of voltage Vcc instead of voltage Vpp on the gates of the CGT$_k$ transistors in order to limit the electrical stress on these transistors, as this was already suggested earlier.

II. Correction of the Effects from the Breakdown of an Access Transistor During the Programming Phases.

Figure 8:
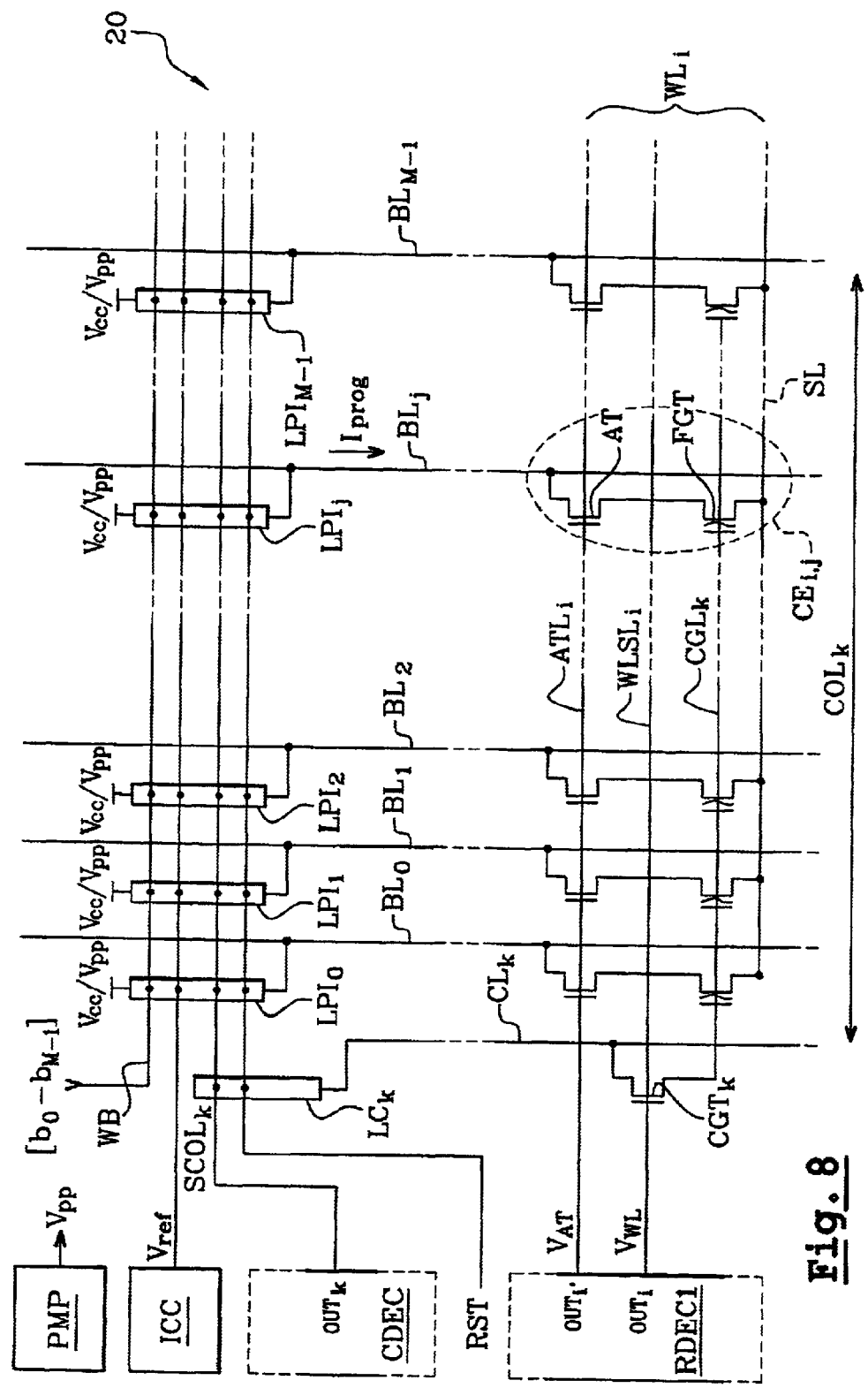
FIG. 8 is the diagram of an EEPROM memory according to the present invention.

FIG. 8 is a more extended view of the memory 20 according to the invention. The architecture of a word line WL$_i$ according to the invention and the line decoder RDEC1 are again illustrated. A conventional column decoder CDEC, a conventional column latch LC$_k$ which is connected to line CL$_k$ and programming latches LPI$_i$ to LPI$_{l-1}$ according to the invention are also illustrated. These latches are connected to the bit lines BL$_0$ to BL$_{M-1}$ of the COL$_k$ column as well as to a data bus WB allowing bits to be programmed to be applied to the latches. They also receive a reset signal RST and a column selection signal SCOL$_k$. The other components of the memory are not illustrated and for example, they are identical with those illustrated in FIG. 1 as described above.

According to the invention, each programming latch LPI$_j$ is current-controlled by a current control circuit ICC, and it delivers to the bit line BL$_j$ to which it is attached, during a programming phase, a current which cannot exceed a maximum value Imax. This maximum value Imax is calculated in such a way that the sum of the delivered currents in each of the bit lines does not exceed the maximum current which may be delivered by the voltage source Vpp, here a charge pump PMP.

It will be assumed that the memory comprises M columns of M bit lines each, and that n*M memory cells are programmed simultaneously (programming of a sequence of 0s in an entire page of the memory). If the memory is sound, each bit line is crossed by a rated programming current Iprog and the current delivered by the charge pump is equal to n*M*Iprog. If, on the other hand, a bit line comprises a broken-down access transistor, this bit line is crossed by a leak current I$_f$ which is significantly larger than Iprog but which is limited to the value Imax imposed by the relevant programming latch.

Thus, if it is assumed that each column comprises a broken-down access transistor, the total current IP delivered by the charge pump is equal to:

$$IP = n*Imax + n(M-1)Iprog \qquad (1)$$

By designating as IPmax the maximum current which may be delivered by the charge pump, it is inferred that the current Imax imposed in each bit line should be less than:

$$Imax \leq [IPmax - n(M-1)Iprog]/n \qquad (2)$$

Under these conditions, the voltage Vpp delivered by the charge pump should not collapse during a programming phase, and the problem discussed earlier in connection with FIG. 3C is solved.

It is assumed for calculating equation (2) that a maximum of one faulty access transistor is accepted per column, and this corresponds to the case when an EEC code is provided for correcting only one per bit string. However, if an ECC code is provided for correcting K bits per bit string, the relationship (2) becomes:

$$I\max < [IP\max - n(M-K)I\text{prog}]^*K \qquad (3)$$

as K erroneous bits may be tolerated in a string of bits.

Figure 9:
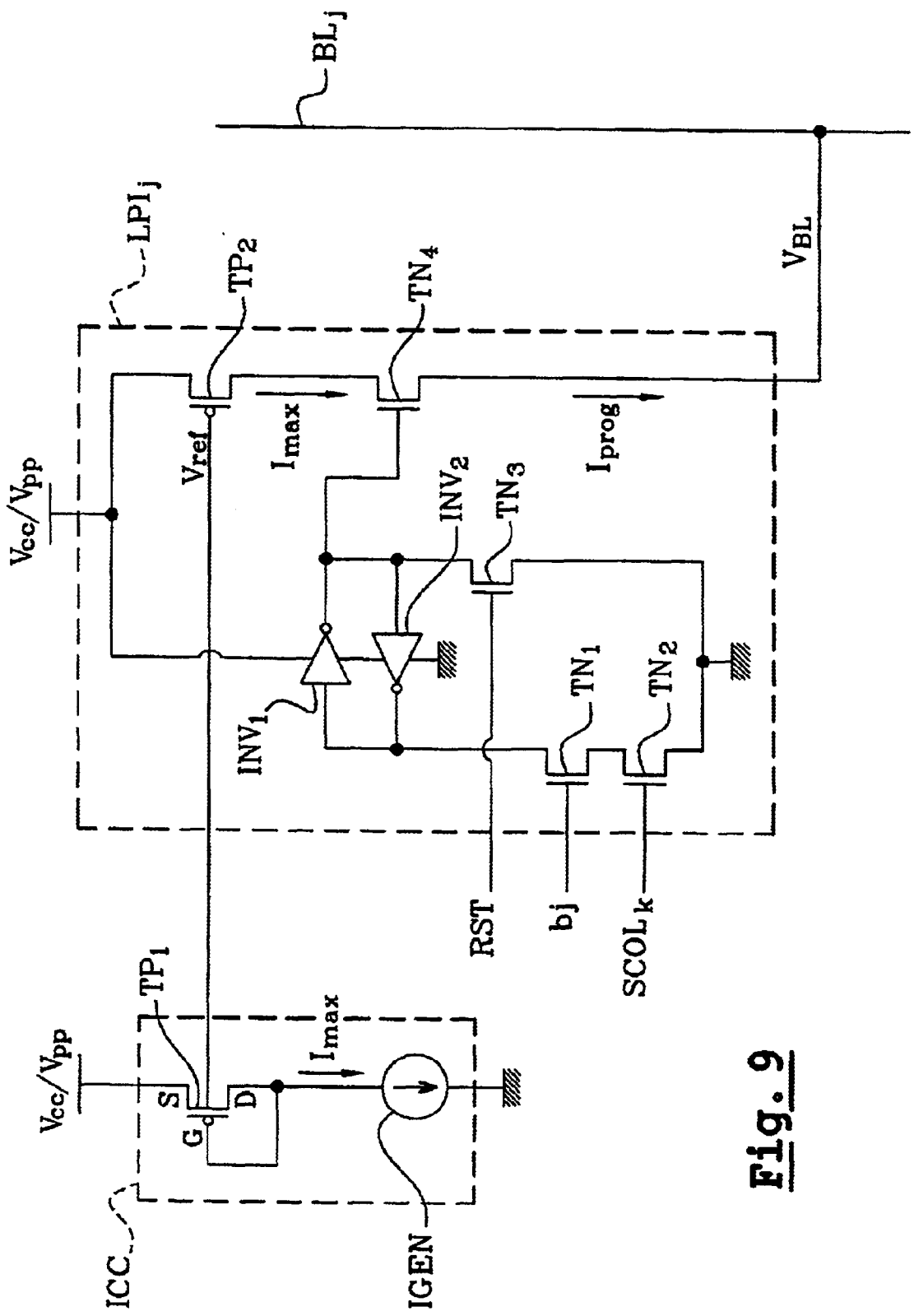
FIG. 9 is the diagram of a programmable latch according to the present invention.
Figure 1:
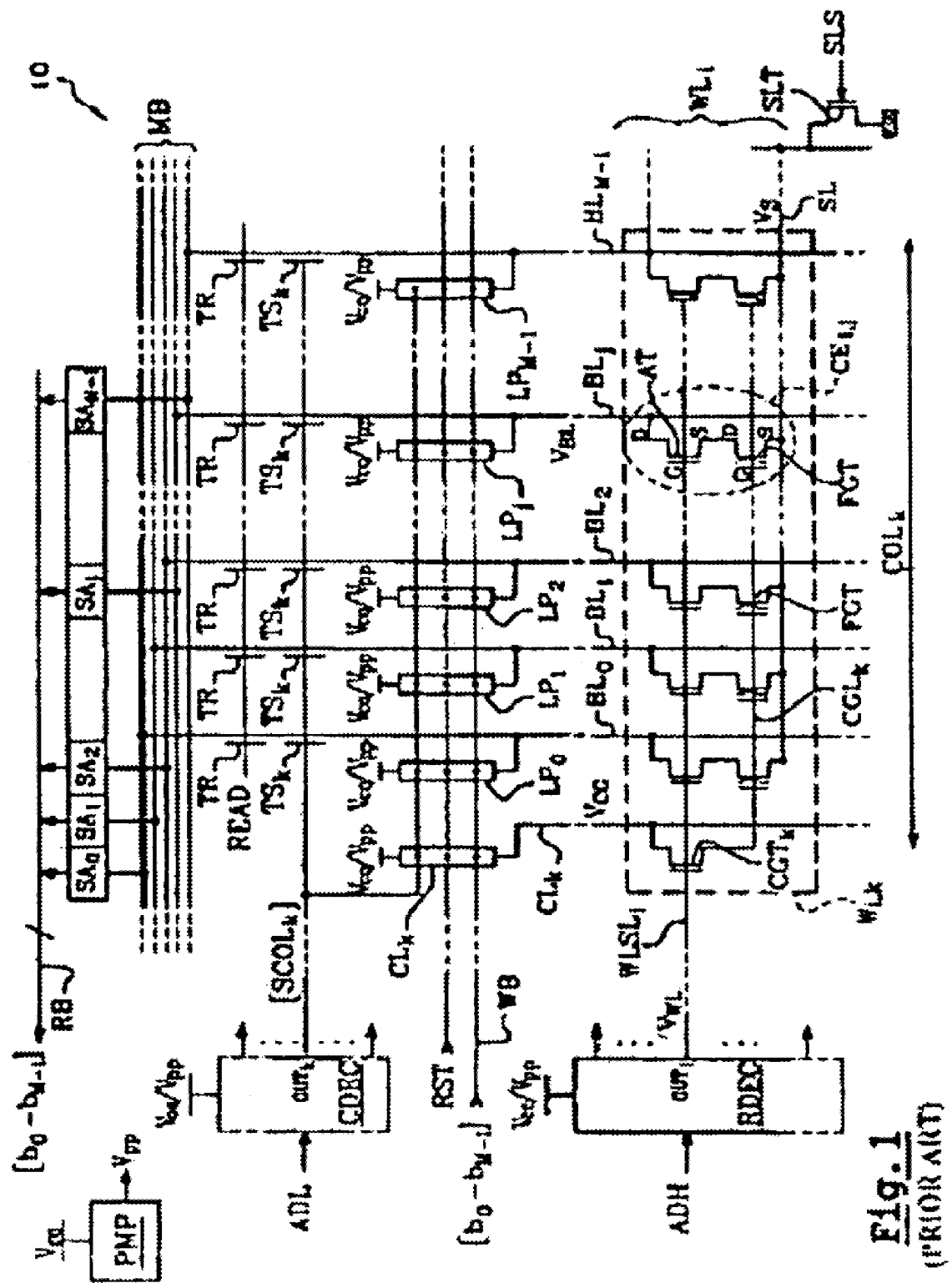

FIG. 9 represents an exemplary embodiment of the ICC circuit and of a programming latch $LPI_j$ according to the invention, wherein the current mirror principle is used. Circuit ICC comprises a PMOS transistor TP1 with its gate connected back to its drain, laid out in series with a current generator IGEN imposing a current Imax in transistor TP1. A voltage Vref is picked up on the gate of transistor TP1 and is applied to the programming latch $LPI_j$.

Latch $LPI_j$ conventionally comprises a volatile memory cell formed by two inverting gates INV1, INV2 connected head-to-tail. The input of gate INV1 is connected to ground via both NMOS transistors TN1, TN2. Transistor TN1 receives on the gate a bit $P_j$ from the data bus WB, and transistor TN2 receives the column selection signal $SCOL_k$. The output of gate INV1 is connected to ground via a NMOS transistor TN3, driven by the reset signal RST. The output of gate INV1 is connected to the gate of an NMOS transistor TN4 forming the output transistor of the latch. Transistor TN4 has its source connected to a bit line $BL_j$ associated with the latch and its drain receives the voltage Vcc/Vpp, i.e., the voltage Vcc during the loading of bit $B_j$ and the voltage Vpp during the actual programming phase.

According to the invention, the voltage Vcc/Vpp is applied on the drain of the TN4 transistor via a PMOS transistor TP2, with a gate width/length (W/L) ratio identical with that of transistor TP1 of the ICC circuit, and forms a current limiter. The gate of transistor TP2 receives the Vref signal delivered by the control circuit ICC.

When a bit set to 0 is applied to transistor TN1 and the selection signal $SCOL_k$ is applied to transistor TN2, the output of gate INV1 switches to 1 and the transistor TN4 conducts. When the Vcc voltage rises to Vpp, transistor TN4 delivers the voltage Vpp on the bit line $BL_j$ and a programming current Iprog flows in the bit line. If the memory cells connected to the bit line $BL_j$ are sound, current Iprog is on the order of 1 nanoampere since programming by the tunnel effect only consumes a very low current, unlike programming by injection of hot carriers (flash memories). If, on the other hand, a memory cell connected to the bit line $BL_j$ has a broken-down access transistor, the current delivered in the bit line increases very strongly but is limited by transistor TP2 to the value Imax, for example, selected to be on the order of 1 microampere.

In the above, a method and an EEPROM memory architecture were described which allows the effects from the breakdown of access transistors to be neutralized with regards to the neighboring cells in the erasing phase and in the programming phase. The present invention may be implemented in combination with the provision of an ECC code for correcting at least one erroneous bit in each word $W_{i,k}$ of the memory. The obtained memory will be resistant to faults indifferently stemming from an oxide breakdown either in an access transistor or in a floating gate transistor. ECC codes with a greater length may also provide, upon readout, correction of faults affecting two or even more cells in each word $W_{i,k}$.

Of course, the present invention is open to different alternatives within the reach of one skilled in the art, both in regards to the selection of the voltage to be applied on the gates of the access transistors during the erasing periods, the selection of means for applying such a voltage and the selection of means for limiting the programming current Iprog in the bit lines during the programming periods.

The present invention is also applicable to different EEPROM memory structures. In particular, although an EEPROM memory of the page programmable type was described above, comprising as many programming latches as bit lines, the method according to the invention is also applicable to a word programmable memory only comprising M programming latches. In this case and as in the above, the current limiters according to the invention are laid out in the M latches or in the lines connecting each latch to the output of the voltage source Vpp.

What is claimed is:

1. An electrically programmable and erasable memory comprising:
    at least one word line;
    a plurality of memory cells connected to said at least one word line and defining a plurality of words,
    a plurality of gate control transistors;
    each memory cell comprising a floating gate transistor and an access transistor, said floating gate transistor comprising a control terminal and first and second conduction terminals, and said access transistor comprising a control terminal and a first conduction terminal connected to the second conduction terminal of said floating gate transistor;
    each gate control transistor comprising a control terminal and a first conduction terminal connected to the control terminals of said floating gate transistors within a same word;
    first and second signal means for applying, during an erasing phase, a first signal to the control terminals and a second signal to the second conduction terminals of said floating gate transistors within a word to be erased, the first signal being applied through said gate control transistor corresponding to the word to be erased; and
    third signal means for applying, to the control terminals of the corresponding access transistors for accessing the memory cells of the word to be erased, a third signal having a voltage that is different from a voltage of the first signal and that is substantially the same as a voltage of the second signal.

2. A memory according to claim 1, wherein the voltage of the second signal is zero during the erasing phase.

3. A memory according to claim 1, wherein the voltage of the third signal is zero during the erasing phase.

4. A memory according to claim 1, wherein the third signal is brought to a floating potential during the erasing phase.

5. A memory according to claim 1, wherein said plurality of memory cells are arranged in rows and columns, with the rows being connected to word lines; and further comprising:
    a row decoder connected to the word lines for delivering at least one word line selection signal during at least one of a programming phase, a reading phase and the erasing phase;
    first conduction means for conveying the at least one word line selection signal to the control terminals of the access transistors of a corresponding word line;

second conduction means for conveying the at least one word line selection signal to the control terminals of the gate control transistors of the corresponding word line; and prevention means for preventing application of the at least one word line selection signal to the control terminals of the access transistors of the corresponding word line during the erasing phase and for applying the third signal thereto instead.

6. A memory according to claim 5, wherein said prevention means comprise:
a logic circuit connected to said first conduction means and having a first input for receiving the at least one word line selection signal and a second input for receiving a control signal, said logic circuit for copying the at least one word line selection signal to said first conduction means when the control signal has a first value and for delivering the third signal instead when the control signal has a second value.

7. A memory according to claim 1, wherein each access transistors comprises a second conduction terminal; wherein said plurality of memory cells are arranged in rows and columns, with the columns being connected to bit lines via the second conduction terminals of said access transistors; further comprising current limit means connected to said bit lines for limiting a programming current flowing in at least one of said bit lines during a programming phase of a corresponding one memory cell.

8. A memory according to claim 7, wherein said current limit means comprise a plurality of current limiters, each current limiter between a respective bit line and a programming voltage source.

9. A memory according to claim 8, wherein said current limit means further comprises a plurality of programming latches, each programming latch being connected to a respective bit line and including one of said plurality of current limiters therein.

10. A memory according to claim 8, wherein each current limiter comprises a transistor; and wherein said current limit means comprises a current control circuit for providing a reference voltage to each transistor.

11. A memory according to claim 1, further comprising:
means for applying to the control terminals of said gate control transistors of a word to be programmed, during a programming phase, a voltage lower than a programming voltage.

12. An electrically programmable and erasable memory comprising:
a plurality of memory cells arranged in rows and columns, each memory cell comprising a floating gate transistor and an access transistor, said floating gate transistor comprising a gate, a source and a drain, and said access transistor comprising a gate, and a source connected to the drain of said floating gate transistor;
a plurality of word lines connected to the rows of said plurality of memory cells for defining a plurality of words;
a plurality of gate control transistors connected to said plurality of memory cells, each gate control transistor comprising a gate, and a source connected to the gates of said floating gate transistors within a same word;
a plurality of bit lines connected to the columns of said plurality of memory cells; and
a row decoder connected to the word lines for applying, during an erasing phase
a first signal to the gates of the floating gate transistors within a word to be erased,
a second signal to the drains of the floating gate transistors within the word to be erased,
a third signal to the gates of corresponding access transistors for accessing the memory cells of the word to be erased, the third signal having a voltage that is different from a voltage of the first signal and that is substantially the same as a voltage of the second signal, and
at least one word line selection signal to the gate of the gate control transistor of the corresponding word line.

13. A memory according to claim 12, wherein the voltage of the second signal is zero during the erasing phase.

14. A memory according to claim 12, wherein the voltage of the third signal is zero during the erasing phase.

15. A memory according to claim 12, wherein the third signal is brought to a floating potential during the erasing phase.

16. A memory according to claim 12, wherein said row decoder further comprises a prevention circuit for preventing application of the at least one word line selection signal to the gates of the access transistors of the corresponding word line during the erasing phase and for applying the third signal thereto instead.

17. A memory according to claim 16, wherein said prevention circuit has a first input for receiving the at least one word line selection signal and a second input for receiving a control signal, said prevention circuit for copying the at least one word line selection signal to the gates of the access transistors of the corresponding word line when the control signal has a first value and for delivering the third signal thereto instead when the control signal has a second value.

18. A memory according to claim 12, further comprising a current limit circuit connected to the bit lines for limiting a programming current flowing in at least one of the bit lines during a programing phase of a corresponding memory cell.

19. A memory according to claim 18, wherein said current limit circuit comprises a plurality of programming latches, each programming latch between a respective bit line and a programming voltage source.

20. A memory according to claim 19, wherein each programming latch comprises a transistor; and wherein said current limit circuit provides a reference voltage to each transistor.

21. A memory according to claim 12, wherein said row decoder applies to the gates of said gate control transistors, during a programming phase, a voltage lower than a programming voltage.

22. A method for programming and erasing memory cells within an electrically programming and erasable memory, the memory comprising at least one word line; a plurality of memory cells connected to the at least one word line and defining a plurality of words; a plurality of gate control transistors; each memory cell comprising a floating gate transistor and an access transistor, the floating gate transistor comprising a gate, a source and a drain, and the access transistor comprising a gate, and a source connected to the drain of the floating gate transistor; each gate control transistor comprising a gate and a source connected to the gates of the floating gate transistors within a same word, the method comprising:
applying, during an erasing phase, a first signal to the gates and a second signal to the drains of the floating gate transistors within a word to be erased, the first signal being applied through the gate control transistor corresponding to the word to be erased; and applying, to the gates of the corresponding access transistors for accessing the memory cells of the word to be erased, a third signal having a voltage that is different from a voltage of the first signal and that is substantially the same as a voltage of the second signal.

23. A method according to claim 22, wherein the voltage of the second signal is zero during the erasing phase.

24. A method according to claim 22, wherein the voltage of the third signal is zero during the erasing phase.

25. A method according to claim 22, wherein the third signal is brought to a floating potential during the erasing phase.

26. A method according to claim 22, the memory further comprises a row decoder connected to the at least one word line for delivering at least one word line selection signal during at least one of a programming phase, a reading phase and the erasing phase; further comprising:

conveying the at least one word line selection signal to the gates of the access transistors of a corresponding word line for accessing the memory cell to be programmed or read;

conveying the at least one word line selection signal to the gates of the gate control transistors of the corresponding word line; and preventing application of the at least one word line selection signal to the gates of the access transistors of the corresponding word line during the erasing phase and for applying the third signal thereto instead.

27. A method according to claim 26, wherein conveying the at least one word line selection signal to the gates of the access transistors is performed via a first conduction path between the row decoder and the gate of the access transistor; wherein the memory further comprises a prevention circuit for performing the preventing, the prevention circuit comprising a logic circuit connected to the first conduction path and having a first input for receiving the at least one word line selection signal and a second input for receiving a control signal, the prevention circuit for copying the at least one word line selection signal to the first conduction path when the control signal has a first value and for delivering the third signal thereto instead when the control signal has a second value.

28. A method according to claim 22, wherein each access transistor comprises a drain; the plurality of memory cells are arranged in rows and columns, with the columns being connected to bit lines via the drains of the access transistors; the programming of a memory cell comprising:

applying a programming voltage on a bit line connected to the access transistor of the memory cell to be programmed; and limiting a programming current flowing in the bit line if the programming current reaches a determined value.

29. A method according to claim 22, wherein the limiting is performed using a current limiter comprising a plurality of current limiters, each current limiter between a respective bit line and a programming voltage source.

30. A method according to claim 22, further comprising applying to the gates of the gate control transistors of a word to be programmed, during a programming phase, a voltage lower than a programming voltage.

* * * * *

UNITED STATES PATENT AND TRADEMARK OFFICE
CERTIFICATE OF CORRECTION

PATENT NO.       : 6,934,192 B2                                    Page 1 of 2
APPLICATION NO.  : 10/178796
DATED            : August 23, 2005
INVENTOR(S)      : Francois Tailliet et al.

It is certified that error appears in the above-identified patent and that said Letters Patent is hereby corrected as shown below:

The sheet of drawing consisting of figure 1, should be deleted to appear as per attached figure 1.

Column 2, Table 1    Delete: "Table 1"
                     Insert -- new Table 1 --

TABLE 1

| Operation⇒ Control signals ⇓ | ERASING | PROGRAMMING | READOUT |
|---|---|---|---|
| $V_{CG}$ | Vpp | 0 (ground) | Vread |
| $V_{WL}$ | Vpp | Vpp | Vcc |
| $V_s$ | 0 (ground) | floating | 0 (ground) |
| $V_{BL}$ | floating | Vpp | Vsense |

Column 9, Table 2    Delete: "Table 2"
                     Insert -- new Table 2 --

TABLE 2

| Operation⇒ Control signals ⇓ | ERASING | PROGRAMMING | READOUT |
|---|---|---|---|
| $V_{CG}$ | Vpp | 0 (ground) | Vread |
| $V_{WL}$ | Vpp | Vpp (or Vcc) | Vcc |
| $V_{AT}$ | 0 (ground) | Vpp | Vcc |
| $V_s$ | 0 (ground) | floating | 0 (ground) |
| $V_{BL}$ | floating | Vpp | Vsense |

Column 16, Line 23   Delete: "claim 22"
                     Insert -- claim 28 --

Signed and Sealed this

First Day of July, 2008

JON W. DUDAS
*Director of the United States Patent and Trademark Office*